United States Patent [19]

Yerman

[11] 4,331,970
[45] May 25, 1982

[54] USE OF DISPERSED SOLIDS AS FILLERS IN POLYMERIC MATERIALS TO PROVIDE MATERIAL FOR SEMICONDUCTOR JUNCTION PASSIVATION

[75] Inventor: Alexander J. Yerman, Scotia, N.Y.

[73] Assignee: General Electric Company, Schenectady, N.Y.

[21] Appl. No.: 201,143

[22] Filed: Oct. 27, 1980

Related U.S. Application Data

[63] Continuation of Ser. No. 943,330, Sep. 18, 1978, abandoned.

[51] Int. Cl.³ .................... H01L 23/28; H01L 29/30; H01L 39/02
[52] U.S. Cl. ........................................ 357/72; 357/80; 357/52; 357/73; 148/33.3; 148/33; 427/82
[58] Field of Search ................... 357/72, 74, 73, 80, 357/54, 52; 148/33, 33.3; 427/82

[56] References Cited

U.S. PATENT DOCUMENTS

| 3,284,678 | 11/1966 | McBride | 357/72 |
|---|---|---|---|
| 3,684,592 | 8/1972 | Chang et al. | 357/72 |
| 3,686,139 | 8/1972 | Lubin | 357/72 |
| 3,911,475 | 10/1975 | Szedon et al. | 357/72 |
| 3,939,488 | 2/1976 | Wakashima et al. | 357/72 |
| 3,943,547 | 3/1976 | Nagano et al. | 357/54 |
| 4,001,655 | 1/1977 | Voyles et al. | 357/72 |
| 4,017,340 | 4/1977 | Yerman | 357/73 |
| 4,096,521 | 6/1978 | Spanjer | 357/72 |
| 4,124,864 | 11/1978 | Greenberg | 357/72 |
| 4,174,531 | 11/1979 | McCarthy et al. | 357/72 |

Primary Examiner—Andrew J. James
Attorney, Agent, or Firm—William A. Teoli; James C. Davis, Jr.

[57] ABSTRACT

Rutile, lead zirconate and barium titanate are employed as a filler material in a polymeric material to improve the electrical characteristics thereof for use as a surface coating on semiconductor devices.

9 Claims, 2 Drawing Figures

USE OF DISPERSED SOLIDS AS FILLERS IN POLYMERIC MATERIALS TO PROVIDE MATERIAL FOR SEMICONDUCTOR JUNCTION PASSIVATION

This application is a continuation of copending application Ser. No. 943,330, filed Sept. 18, 1978, now abandoned.

BACKGROUND OF THE INVENTION

1. Field of the Invention

This invention relates to protective and encapsulant coating materials characteristics for semiconductor elements.

2. Description of the Prior Art

Heretofore, some prior art methods provide coating at least preselected exposed surface areas of semiconductor elements with electrically insulating oxide materials. Such coatings are then layers and have virtually no resistance to mechanical abrasion and require relatively expensive processing equipment. In almost all instances, a second and a thicker coat of a protective coating material is provided to protect the initial electrically-insulating material. Silicon greases, varnishes, rubber and resins which are employed as the overcoating of protective material have been found lacking in desirable physical characteristics.

Robert R. Shaw in U.S. Pat. No. 3,615,913, granted on Oct. 26, 1970, teaches the employment of a coating of a cured, protective coating material selected from the group consisting of polyimides, and polyamide-polyimides disposed on exposed end portions of at least one P-N junction to provide passivation thereof. Although these materials exhibited good abrasion-resistance properties, the passivation requirements of the semiconductor element still require improvements to be made thereto.

Additionally, Shaw made use of silicon oxide, glass fibers, boron nitride, aluminum oxide, quartz, mixa, magnesium oxide and reactivated polytetrafluoroethylene and the like to control the consistency of the polymeric material for application to selected surface areas. Alizarin has also been admixed into various coating materials to aid in a sort of surface cleanup treatment for semiconductor materials.

There is currently wide-spread use of oxide/glass layers for passivation and encapsulation of semiconductor devices where device stability and long life are important considerations. However, if the glassy layer must be applied after aluminum metallization, (a widespread requirement), the choice of suitable glass systems is severely circumscribed by a maximum permissible application temperature of ~577° C. This restriction is set by the aluminum-silicon eutectic and must be carefully observed in all processing operations following aluminization of the silicon.

Several glass coating methods are currently in use. These include chemical vapor deposition (CVD), glass frits, and spin-on glass forming alcoholates. The last method is only capable of forming very thin layers, of the order of 2000 A, of glasses which tend to be more reactive than desirable and, therefore, are of restricted utility in packaging. Glass frits are widely used in packaging but are not usually employed for surface passivation because of difficulties in formulating glasses with an adequate expansion match to silicon, and which are at the same time suitable passivants and chemically stable. CVD methods permit adequate thickness, a wide choice of composition, expansion matching, etc. but difficulties in controlling sodium contamination in CVD reactors have made it difficult to obtain acceptable passivation layers by direct deposition onto base silicon. This method is, therefore, usually restricted to use as an overcoating of $SiO_2$ and metallization layers. None of these methods in their current state of development is considered capable of providing a reliable passivation/encapsulation method for large thyristors and other power semiconductor devices.

Recently, a passivation coating material was developed for coating electronic components. The material is a copolymer which is a reaction product of a silicon-free organic diamine, an organic tetracarboxylic dianhydride and a polysiloxane. This material is a significant improvement over prior art materials, exhibiting better adhesion and corona resistance than available polyimide and polyamide-imide coatings. In view of its useful surface characteristics, it is desirable to use such material for coating high voltage semiconductor devices. In such devices it is desirable that the surface coating reduce the high electric fields which occur at the silicon surface to low enough values so that surface breakdown or corona does not occur in the surrounding air, and surface leakage is not significant. It is difficult to do this with very thin layers of polymer materials. The building up of thick layers of defect-free coatings is time-consuming and expensive.

It is an object of this invention to provide a new and improved material for use as a passivation coating material for electronic components which incorporate selective filler materials to enhance the electronic characteristics thereof.

Other objects of this invention will, in part, be obvious and will, in part, appear hereinafter.

BRIEF DESCRIPTION OF THE INVENTION

In accordance with the teachings of this invention, there is provided a semiconductor element embodying a body of semiconductor material having at least two regions of opposite-type conductivity. A P-N junction is disposed between, and formed by the abutting surfaces of, each pair of regions of opposite-type conductivity. An end portion of at least one P-N junction is exposed at a surface of the body.

A layer of an organic material with, or without, silicone material contained therein is disposed on a selected surface area of the element and the end portion of at least one P-N junction exposed thereat. The layer of material is a passivation coating and/or an encapsulant for the surface area coated thereby. The organic material is one selected from the class of materials consisting of (a) a reaction product of a silicon-free organic diamine and an organic tetracarboxylic acid dianhydride which is a polymer which has the recurring structural units of the formula:

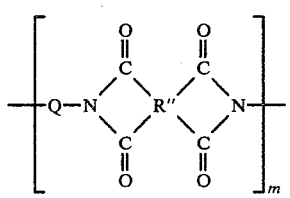

(I)

(b) a reaction product of a silicon-free organic diamine, an organic tetracarboxylic acid dianhydride and an amino terminated polysiloxane which is a polymer having the recurring structural units of formula I with from 15 to 45 mol percent intercondensed structural units of the formula:

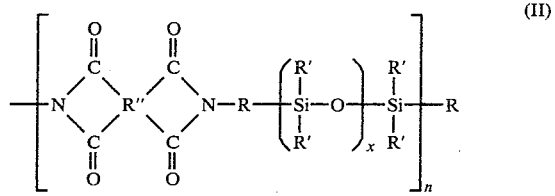

(II)

and,
(c) a blend of polyimide cympound of formula (I) above with from 15 to 45 mol percent of the polyimide of formula (II) above wherein
R is a divalent hydrocarbon radical;
R' is a monovalent hydrocarbon radical;
R" is a tetravalent organic radical;
Q is a divalent silicon-free organic radical which is the residue of an organic diamine;
x is an integer having a value greater than zero and advantageously from 1 to 8 but possibly as high as 10,000, and
m and n are integers greater than one and may be equal to 10 to 10,000 or more.

Either of the materials has admixed therein a filler material which is one selected from the group consisting of rutile, lead zirconate and barium titanate. The filler material enhances the electrical characteristics of the polymeric material by adjusting the dielectric constant thereof and providing a high dielectric constant material.

DESCRIPTION OF THE INVENTION

Figure 1:
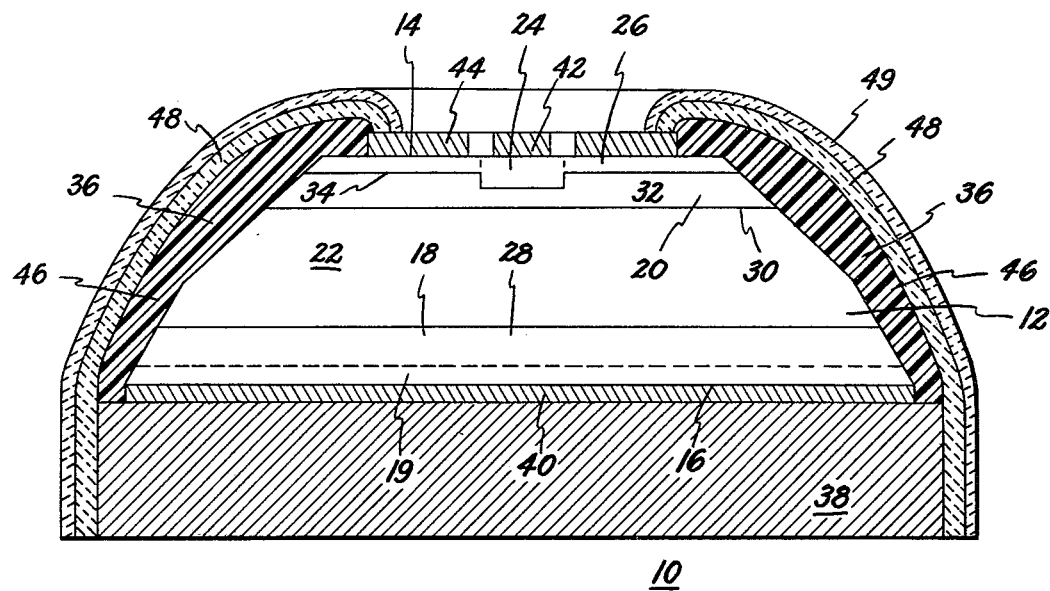
FIGS. 1 and 2 are side elevation views, in cross-section of semiconductor elements embodying the novel polymeric materials of this invention.

With reference to FIG. 1, there is shown a semiconductor element 10 comprised of a body 12 of semiconductor material. The body 12 is prepared by suitable means, such, for example, as by polishing and lapping to parallelism two opposed surfaces 14 and 16. The body 12 comprises a suitable semiconductor material such, for example, as silicon, silicon carbide, germanium, compounds of Group II and Group VI elements, and compounds of Group III and Group V elements.

In order to more fully describe the invention and for no other purposes, the body 12 will be described as being comprised of silicon semiconductor material having five regions of conductivity and four P-N junctions. Such a configured element 10 may function as a thyristor. Therefore, the body 12 has regions 18 and 20 of P-type conductivity, regions 19 of P+-type conductivity and regions 22, 24, and 26 of N-type conductivity. P-N junctions 28, 30, 32, 34 are formed by the abutting surfaces of the respective pairs of regions 18 and 22, 22 and 20, 20 and 24, and 20 and 26 of opposite type conductivity.

One means of controlling the surface electric field on such a controlled rectifier is to contour the side surface 36 after affixing the partially processed body 12 to a large area contact, or support electrode, 38 by a layer 40 of a suitable ohmic electrical solder. Electrical contacts 42 and 44 are affixed to the respective regions 24 and 26. As illustrated, the contouring of the surface 36 results in the well known "double bevel" surface.

Figure 2:
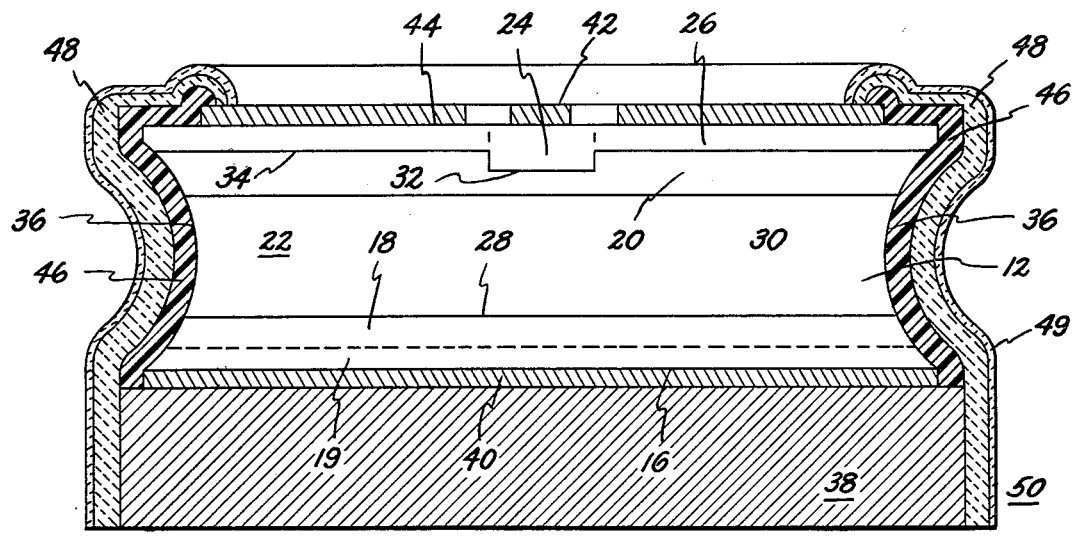

Referring now to FIG. 2, there is shown a semiconductor element 50 embodying a double positive bevel configuration for controlling surface electric field. All items denoted by the same reference numbers as those in element 10 of FIG. 1 are the same, and function in the same manner, as the corresponding item in element 10. The element 50 functions as a thyristor for the configuration illustrated.

Regardless of the method employed to control the surface electric field, selected end portions of at least some of the P-N junctions are exposed at surface areas of the body 12. It is necessary therefore to apply a suitable material to protect the exposed end portions of the P-N junctions.

A layer 46 of an encapsulant or a protective coating material is disposed on at least the surface 36 and the exposed end portion of at least the P-N junctions 28 and 30. It is desirable that the material of the layer 46 adhere to the surface 36 as well as to the material of the layer 44 and the contact, or support electrode 38. The material of the layer 46 must have adequate dielectric properties and also be capable of withstanding elevated temperatures encountered in processing the element 10. Additionally, the material of the layer 46 must be capable of providing, when cured, an adherent bond to the selected surface of the element 10 and should exhibit good abrasion resistance, as well as resistance to the chemical reagents utilized in completing the fabrication of the element 10.

An encapsulant, which is also a protective coating material such, for example, as a polyimide-silicone copolymer, has been found to be such a desirable material when disposed on at least the surface 36 and the exposed end portion of at least the P-N junctions 28 and 30.

The encapsulant or protective coating material may be disposed on the surface 36 as a polymer precursor dissolved in a suitable solvent. Upon heating, the solvent is evaporated and the protective coating material of the layer 46 is polymerized in situ on the surface 36 and the end portion of at least one P-N junction. Preferably, the material of the layer 46 is applied to the preselected surface area of the surface 36 of the body 12 as a solution of a soluble polymeric intermediate. Application of the material to at least the surface 36 of the body 12 is by such suitable means as spraying, spinning, brushing and the like. The body 12 with the applied protective coating material is then heated to concert the resinous soluble polymer intermediate to a cured, solid, and selectively insoluble material.

A suitable material for comprising the layer 46 and meeting the aforesaid requirements is either
(1) a reaction product of a silicon-free organic diamine and an organic tetracarboxylic acid dianhydride in a suitable organic solvent which, when cured, yields a polymer having recurring structural units of the formula:

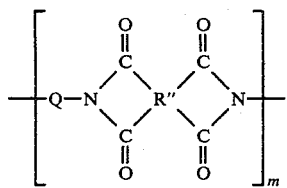

(2) a reaction product of a silicon-free o-ganic diamine, an organic tetracarboxylic acid dianhydride and a polysiloxane diamine, in a suitable organic solvent, which, when cured, yields a copolymer having recurring structural units of formula I with 15 to 45, and preferably 25 to 35, mol percent intercondensed structural units of the formula:

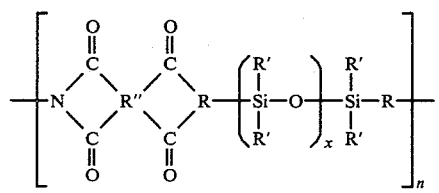

and, (3) a blend of polyimide compound of formula I above with from 15 to 45 mol percent, and preferably 25 to 35 mol percent, of the polyimide of formula II above wherein R is a divalent hydrocarbon radical, r' is a monovalent hydrocarbon radical, R" is a tetravalent organic radical, Q is a divalent silicon-free organic radical which is the residue of an organic diamine, x is a whole number equal to at least 1 and advantageously from 1 to 8 and as high as 1 to 10,000 or more, m and n are the same or different integers greater than 1 and preferably from 10 to 10,000 or more.

The above mentioned block or random copolymers can be prepared by effecting reaction, in the proper molar proportions, of a mixture of ingredients comprising a diamino-siloxane of the general formula:

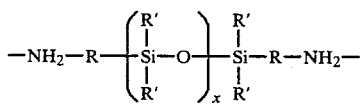

a silicon-free diamino compound of the formula:

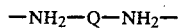

and a tetracarboxylic acid dianhydride having the formula:

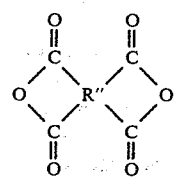

wherein R, R', R", Q and x have the meanings given above.

Alternatively, as stated before, a polysiloxaneimide composition in a suitable solvent may be used with comparable effectiveness by blending together a polyimide composed solely of recurring structural units of Formula II employing the polyimide of Formula II in such a molar proportion that the structural units of the latter are within the range of from 15 to 40, and preferably 25 to 35, mol percent of said units based on the total molar concentration of the units of Formula II and the units of Formula I. The blend of materials is applied to suitable surface areas and the solvent evaporated in situ therefrom.

It will be recognized that the ultimate polyimide siloxane composition used in the practice of this invention will consist essentially of the imido structures found in Formulas I and II. However, the actual precursor materials resulting from the various reactions of the diamino-siloxane, the silicon-free organic diamine and the tetracarboxylic acid dianhydride will initially be in the form of a polyamic acid structure composed of one or more structural units of the formulas:

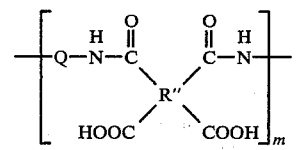

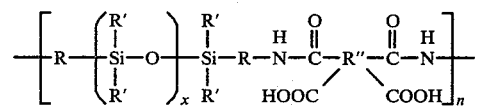

where R, R', R", Q, x, m and n have the meanings given above.

The diamino siloxanes of Formula III which may be used in the practice of the present invention include compounds having the following formulas:

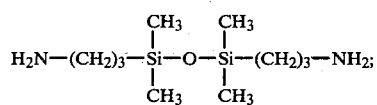

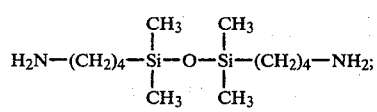

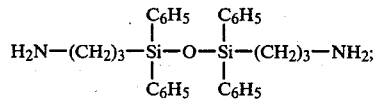

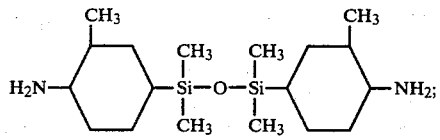

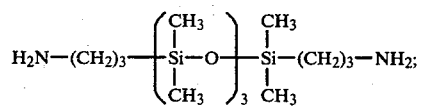

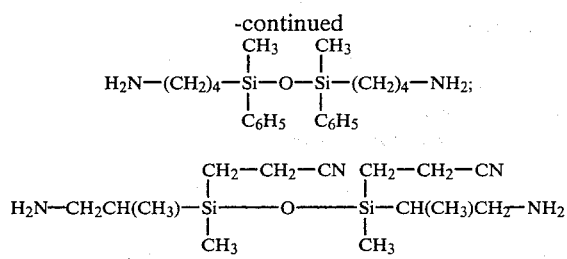

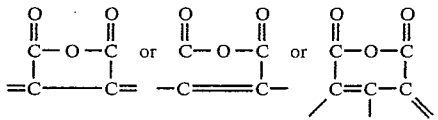

and the like.

The diamines of Formula IV above are described in the prior art and are to a large extent commercially available materials. Typical of such diamines from which the prepolymer may be prepared are the following:
m-phenylenediamine;
p-phenylenediamine;
4,4'-diaminodiphenylpropane;
4,4'-diaminodiphenylmethane;
4,4'-methylene dianiline;
benzidine;
4,4'-diaminodiphenyl sulfide;
4,4'-diaminodiphenyl sulfone;
4,4'-diaminodiphenyl ether;
1,5-diaminophthalene;
3,3'-dimethylbenzidine;
3,3'-dimethoxybenzidine;
2,4-bis(β-amino-t-butyl)toluene;
bis(p-β-amino-t-butylphenyl)ether;
bis(p-β-methyl-o-aminopentyl)benzene;
1,3-diamino-4-isopropylbenzene;
1,2-bis(3-aminopropoxy)ethane;
m-xylylenediamine;
p-xylylenediamine;
bis(4-aminocyclohexyl)methane;
decamethylenediamine;
3-methylheptamethylenediamine;
4,4-dimethylheptamethylenediamine;
2,11-dodecanediamine;
2,2-dimethylpropylenediamine;
actamethylenediamine;
3-methoxyhexamethylenediamine;
2,5-dimethylhexamethylenediamine;
2,5-dimethylheptamethylenediamine;
3-methylheptamethylenediamine;
5-methylnonamethylenediamine;
1,4-cyclohexanediamine;
1,12-octadecanediamine;
bis(3-aminopropyl)sulfide;
M-methyl-bis(3-aminopropyl)amine;
hexamethylenediamine;
heptamethylenediamine;
nonamethylenediamine;
and mixtures thereof. It should be noted that these diamines are given merely for the purpose of illustration and are not considered to be all inclusive. Other diamines not mentioned will readily be apparent to those skilled in the art.

The tetracarboxylic acid dianhydrides of Formula V may further be defined in that the R″ is a tetravalent radical, e.g. a radical derived from or containing an aromatic group containing at least 6 carbon atoms characterized by benzenoid unsaturation, wherein each of the 4 carbonyl groups of the dianhydride are attached to a separate carbon atom in the tetravalent radical, the carbonyl groups being in pairs in which the groups in each pair are attached to adjacent carbon atoms of the R″ radical or to carbon atoms in the R″ radical at most one carbon atom removed, to provide a 5-membered or 6-membered ring as follows:

$$\begin{array}{ccc} \overset{O}{\underset{\|}{C}}-O-\overset{O}{\underset{\|}{C}} & \overset{O}{\underset{\|}{C}}-O-\overset{O}{\underset{\|}{C}} & \overset{O}{\underset{\|}{C}}-O-\overset{O}{\underset{\|}{C}} \\ | \quad\quad | & | \quad\quad\quad | & | \quad\quad | \\ =C\text{------}C= & -C=\!=\!=\!C- & C=C-C \end{array}$$

Illustrations of dianhydrides suitable for use in the present invention (with their reference designated in parenthesis) include:
pyromellitic dianhydride (PMDA);
2,3,6,7-napthalene tetracarboxylic dianhydride;
3,3',4,4'-diphenyl tetracarboxylic dianhydride;
1,2,5,6-napthalene tetracarboxylic dianhydride;
2,2',3,3'-diphenyl tetracarboxylic dianhydride;
2,2-bis(3,4-dicarboxyphenyl)sulfone dianhydride;
bis(3,4-dicarboxyphenyl)sulfone dianhydride;
2,2-bis[4-(3,4-dicarboxyphenoxy)phenyl]propane dianhydride;
(BPA dianhydride);
2,2-bis[4-(2,3-dicarboxyphenoxy)phenyl]propane dianhydride;
benzophenone tetracarboxylic acid dianhydride (BPDA);
perylene-1,2,7,8-tetracarboxylic acid dianhydride;
bis(3,4-dicarboxyphenyl)ether dianhydride, and
bis(3,4-dicarboxyphenyl)methane dianhydride;
and aliphatic anhydrides such as cyclopentane tetracarboxylic dianhydride, cyclohexane tetracarboxylic dianhydride, butane tetracarboxylic dianhydride, etc. The incorporation of other dianhydrides, such as trimellitic anhydride, to make amideimide-siloxane polymers is not precluded.

Alternately the novel material compositions of this invention has admixed therein a filler material which is one selected from the group consisting of rutile, lead zirconate, and barium titanate. The filler material enhances the electrical characteristics of the encapsulant or passivation material by aiding in the dielectric control thereof and/or interaction of surface affects of the electronic component to which it is applied.

It is desirable that the material of the coating 46 be applied to the surface 36 as a precursor. The precursor or blend solution consists of resinous material in a suitable solvent (including, for example, N-methylpyrrolidone, N,N-dimethylacetamide, N,N-dimethylformamide, etc.) alone or combined with non-solvents, with, or without, a suitable filler material therein. It has been found that a precursor or blend solution wherein from 10 percent to 40 percent solids by weight are contained therein is suitable for semiconductor work. Preferably, the precursor or blend solution has from 20 to 40 percent solid resinous material contained therein. Sufficient material is applied to the surface 36 to provide a layer 46 the thickness of which is from 1 micron to 100 microns.

Application to the surface 30 of the substrate material may be by conventional means such as dipping, spraying, painting, spinning, etc. The block or random copolymers or blends of polymers may be dried in an initial heating step at temperatures of about 75° to 125° C. for a sufficient time frequently under vacuum to remove the solvent. The polyamic acid of the precursor solution is then converted to the corresponding polyimide-siloxane by heating at temperatures of about 150° C.-300° C. for a sufficient time to effect the desired conversion to the polyimide structure and final cure.

A preferred curing cycle for materials of the above general formula is as follows:
 (a) from 15 to 30 minutes of from 135° C. to 150° C. in dry $N_2$.
 (b) from 15 to 60 minutes at about 185° C. ±10° C. in dry $N_2$.
 (c) from 1 to 3 hours at about 225° C. in vacuum.

Alternately, it has been found that one may be able to form the coating material in other atmospheres such, for example, as air for ease of commercial application of this invention.

A suitable polymer precursor solution to include selected filler material is formed by reacting benzophenone tetracarboxylic acid dianhydride with methylene dianiline and bis ($\gamma$-amino propyl)tetramethyldisiloxane. The latter two diamine materials are present in a molar ratio of from 85:15 to 55:45. Preferably, the range of desirable molar ratios of the two diamine materials is from 75:25 to 65:35. An excellent polymer precursor material has a molar ratio of 70:30. The reaction of the chemical ingredients is carried out at a temperature of less than 50° C. using suitably purified and dried materials to favor a large molecular weight polymer.

The polymer precursor solution is in the form of the polyamic acid form dissolved in N-methyl-2-pyrrolidone and contains from 10 to 40 percent by weight solids. Preferably, the solution has on the order of 25 percent by weight solids in the polyamic acid form. To this solution is to be added the materials selected to enhance the electrical characteristics of both the coating material and the selected surface areas of the electronic components to which it is applied.

The dielectric constant of the cured polymer is of the order of about 3.7. The electric field intensity in the unfilled polymer material when applied to selected surface areas of silicon, the dielectric constant of which is 12, is approximately three times the field intensity in silicon, what at reverse breakdown may reach a level of from 1 to $2 \times 10^5$ volts per centimeter. Therefore, the polyimide-silicone copolymer must be able to sustain maximum electric fields of the order of about $6 \times 10^5$ volts per centimeter ($3 \times 2 \times 10^5$ volts per centimeter). By increasing the dielectric constant of a film of polyimide-silicone co-polymer material by introducing selected filler material therein, I lower the electric field which the material must withstand. For example, a material filled with rutile (dielectric constant=90) having an average dielectric constant value of about 12 results in an electric field for the cured film of material of approximately $2 \times 10^5$ volts per centimeter when the filler material is present to the extent of 10% by volume of the cured mixture.

In the filled polymer and filled polyimide-silicone materials, the maximum filler content of the cured resin is of the order of about 50 volume percent, thus the use of rutile as a filler permits the achievement of a maximum dielectric constant of $\sim 47$.

The maximum weight ratio of filler material added to, or admixed in, the precursor solutions depends upon the particle size and shape as well as the density, and the polymer solution solids content. If one assumes spherical particle shapes of rutile configured in a cubic array after curing, and a void-free composite, then the maximum weight of solids which can be effectively added to the precursor solution is:

$$\left[ \frac{W_s}{W_{ps}} \right]_{max} = 3.21 \, WF_p \qquad \text{VII.}$$

wherein
 $W_s$ is the weight of solid filler
 $W_{ps}$ is the weight of polymer solution (precursor)
 $WF_p$ is the weight fraction of polymers in the precursor solution.

For example, some typical values for precursor solutions having rutile as the filler therein are given in the following Table:

| $WF_p$ Wgt. % | $\left(\dfrac{W_s}{W_{ps}}\right)_{max.}$ % |
|---|---|
| 10 | 32 |
| 25 | 80 |
| 40 | 128 |
| 50 | 161 |

Higher values of ($W_s/W_{ps}$) will not yield void-free composites after curing.

The surface charge at the interface of the cured film of coating material and a silicon element is, in some instances, an effect of distributed electrical charge in the coating material. In such instances, a higher dielectric constant has the additional advantage of reducing the value of effective surface charge. This is desirable in those instances of semiconductor P-N junctions having both lightly doped n and p regions where minimizing surface charge factors maximize breakdown and minimize reverse leakage.

A dielectric material which I have found to be an excellent filler material is rutile, a tetragonal form, and the most stable form, of titanium dioxide. Rutile has the very desirable characteristic of a high dielectric constant, it being of the order of 90. This value for the dielectric constant compares most favorably with the dielectric constant of 12 for silicon, 8.6 for 351 glass, a proprietary composition of the General Electric Company, and 3.8 for silicon dioxide.

Generally the leakage and avalanche multiplication in dielectric materials is dependent on electric field intensity. The electric field intensity is inversely proportional to the dielectric constant of the material. A higher dielectric constant has the effect of reducing the field in the dielectric for a given applied voltage. Therefore, the novel passivation or encapsulant material of this invention which has rutile admixed therein is capable of withstanding higher applied voltages than unfilled copolymer materials.

Other suitable filler materials are barium titanate and lead zirconate which act in the same manner as rutile. The range of filler addition to resin solids in a precursor solution varies somewhat from the values listed in the table because of density difference, but can be calculated in the same manner.

The addition of the filler materials also enhances the laser scribeability of the silicon wafer coated with the polymeric materials described herein. This provides a secondary benefit for the use of the desired filler materials.

What I claim as new and desire to secure by Letters Patent of the United States is:

1. A rutile filled polymer system for use as a surface coating to prevent surface breakdown of semiconductor devices comprising rutile and a precursor solution of a polymer material which is one selected from the class of materials consisting of
   (a) a reaction product of a silicon-free organic diamine and an organic tetracarboxylic acid dianhydride which when cured is a polymer having the recuring structural units of the formula,

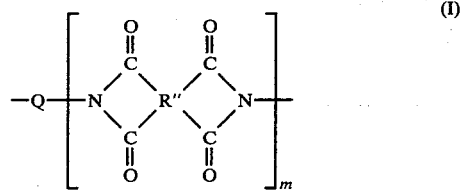
(I)

(b) a reaction product of a silicon-free organic diamine, an organic tetracarboxylic acid dianhydride and an amino terminated polysiloxane, which is a polymer which, when cured, has the recuring structural units of formula (I) with from 15 to 45 mol percent intercondensed structural units of the formula,

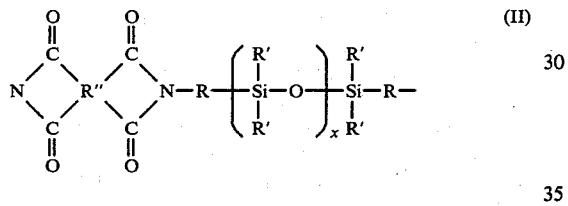
(II)

and
   (c) a blend of polyimide compound of formula (I) above with from 15 to 45 mole percent of the polyimide of formula (II) above wherein the maximum weight of rutile solids which can be used in the rutile filled polymer system to provide a cured void free polymer is expressed by the formula, $$\left[\frac{Ws}{Wps}\right]_{max} = 3.21\ WFp$$

wherein:
Ws is the weight of rutile, Wps is the weight of polymer solution (precursor) and WFp is the weight fraction of polymer in the precursor solution,
   R is a divalent hydrocarbon radical derived from bis(γ-amino propyl)tetramethyldisiloxane;
   R' is a monovalent hydrocarbon radical derived from bis(γ-amino propyl)tetramethyldisiloxane;
   R" is a tetravalent organic radical derived from benzophenone tetracarboxylic acid dianhydride;
   Q is a divalent silicon-free organic radical which is the residue of methylene dianiline;
   x is an integer having a value greater than zero, and
   m and n are integers greater than one, and may be equal to each other, and
   where the rutile is admixed therein and distributed throughout the precursor solution prior to the application of the solution to the surface of the semiconductor device.

2. The filled polymer system of claim 1, where the polymer material is the reaction product of a silicon-free organic diamine and an organic tetracarboxylic acid dianhydride.

3. The filled polymer system of claim 1, wherein the polymer material is the reaction product of a silicon-free organic diamine, an organic tetracarboxylic acid dianhydride and an amino terminated polysiloxane.

4. The filled polymer system of claim 1, wherein the polymer material is a blend of the reaction product of a silicon-free organic diamine and organic tetracarboxylic acid dianhydride and the reaction product of silicon-free organic diamine, an organic tetracarboxylic acid dianhydride and an amino-terminated polysiloxane.

5. A semiconductor device comprising
   a body of semiconductor material having at least two regions of opposite-type conductivity formed therein;
   a P-N junction disposed between, and formed by the abutting surfaces of each pair of regions of opposite-type conductivity;
   an end portion of at least one P-N junction exposed at a surface of the body, and
   a rutile filled polymer system for use as a surface coating to prevent surface breakdown of the device disposed on at least that surface at which the end portion of at least one P-N junction is exposed, and where the rutile filled polymer system comprises rutile, and
   a cured precursor solution of a polymer material which is one selected from the class of materials consisting of
     (a) a reaction product of a silicon-free organic diamine and an organic tetracarboxylic acid dianhydride which when cured is a polymer having the recurring structural units of the formula:

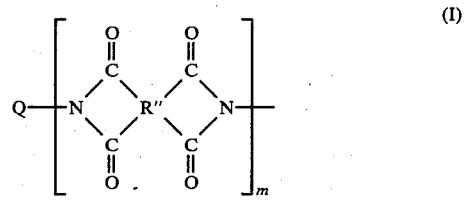
(I)

(b) a reaction product of a silicon-free organic diamine, an organic tetracarboxylic acid dianhydride and an amino terminated polysiloxane, which is a polymer which, when cured, has the recurring structural units of formula (I) with from 14 to 45 mol percent intercondensed structural units of the formula:

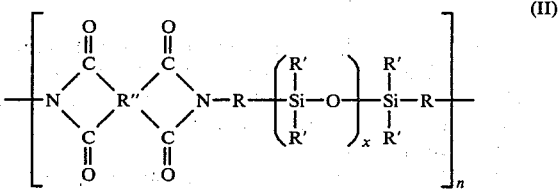
(II)

and
     (c) a blend of polyimide compound of formula (I) above with from 15 to 45 mole percent of the polyimide of formula (II) above wherein:
       R is a divalent hydrocarbon radical derived from bis(γ-amino propyl)tetramethyldisiloxane;

R' is a monovalent hydrocarbon radical derived from bis(γ-amino propyl)tetramethyldisiloxane;

R" is a trivalent organic radical derived from benzophenone tetracarboxylic acid dianhydride;

Q is a divalent silicon-free organic radical which is the residue of methylene dianiline;

x is an integer having a value greater than zero, and m and n are integers greater than one, and may be equal to each other, and where the rutile is admixed therein and distributed throughout the precursor solution prior to the application of the solution to the surface of the semiconductor device and where the maximum weight of rutile solids which can be used in the rutile filled polymer system to provide a cured void free polymer is expressed by the formula, $$\left[\frac{Ws}{Wps}\right]_{max} = 3.21\ WFp$$

wherein:

Ws is the weight of rulte, Wps is the weight of polymer solution (precursor) and WFp is the weight fraction of polymer in the precursor solution.

6. The filled polymer system of claim 5, where the polymer material is the reaction product of a silicon-free organic diamine and an organic tetracarboxylic acid dianhydride.

7. The filled polymer system of claim 5, wherein the polymer material is the reaction product of a silicon-free organic diamine, an organic tetracarboxylic acid dianhydride and an amino terminated polysiloxane.

8. The filled polymer system of claim 5, wherein the polymer material is a blend of the reaction product of a silicon-free organic diamine and organic tetracarboxylic acid dianhydride and the reaction product of the silicon-free organic diamine, an organic tetracarboxylic acid dianhydride and an amino-terminated polysiloxane.

9. The semiconductor device of claim 5, wherein the semiconductor material is silicon.

9. The semiconductor device of claim 5, wherein the semiconductor material is silicon.

* * * * *